(12) United States Patent
Nguyen

(10) Patent No.: US 7,048,800 B2
(45) Date of Patent: May 23, 2006

(54) SEMICONDUCTOR SUBSTRATE PROCESSING APPARATUS

(75) Inventor: Andrew P. Nguyen, San Jose, CA (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/781,187

(22) Filed: Feb. 17, 2004

(65) Prior Publication Data
US 2005/0178321 A1    Aug. 18, 2005

(51) Int. Cl.
B05C 11/02    (2006.01)
B05C 21/00    (2006.01)
B08B 3/02     (2006.01)

(52) U.S. Cl. .................. 118/501; 118/52; 118/612; 134/103.1; 134/902; 134/198

(58) Field of Classification Search .......... 118/52, 118/612, 319, 500, 501; 427/240; 134/103.1, 134/902, 198, 153; 396/604, 611
See application file for complete search history.

(56) References Cited

U.S. PATENT DOCUMENTS

| 5,705,223 A | 1/1998 | Bunkofske |
| 5,762,709 A | 6/1998 | Sugimoto et al. |
| 5,940,651 A | 8/1999 | Pike et al. |
| 5,947,136 A | 9/1999 | Abras |
| 6,432,199 B1 | 8/2002 | Takekuma |
| 6,533,864 B1 | 3/2003 | Matsuyama et al. |
| 6,807,972 B1 * | 10/2004 | Chiu et al. ................. 134/94.1 |
| 2002/0053319 A1 * | 5/2002 | Nagamine ................ 118/52 |
| 2003/0101929 A1 | 6/2003 | Yoshihara et al. |
| 2003/0183250 A1 | 10/2003 | Chiu et al. |

FOREIGN PATENT DOCUMENTS

EP    RS 111749    10/2004

* cited by examiner

Primary Examiner—Chris Fiorilla
Assistant Examiner—Yewebdar T. Tadesse
(74) Attorney, Agent, or Firm—Blakely, Sokoloff, Taylor & Zafman, LLP (57) ABSTRACT

According to one aspect of the invention, a semiconductor substrate, or wafer, processing apparatus is provided. The wafer processing apparatus may include a frame, a semiconductor substrate support, a dispense head connected to the frame to dispense a semiconductor processing fluid onto a substrate on the support, and a catch cup, having a top section and a mid-section, connected to the frame around the wafer support. A portion of an inner surface of the top section may not face towards, or face away from, a central axis of the semiconductor substrate. An upper surface of the mid-section may have substantially no horizontal portions.

35 Claims, 9 Drawing Sheets

SEMICONDUCTOR SUBSTRATE PROCESSING APPARATUS

BACKGROUND OF THE INVENTION

1) Field of the Invention

This invention relates to a semiconductor substrate processing apparatus.

2) Discussion of Related Art

Integrated circuits are typically formed on semiconductor wafers. The formation of the integrated circuits may include numerous processing steps such as deposition of various layers, etching some of the layers, and multiple bakes.

Often the processing of semiconductor wafers takes place in large wafer processing machines. One of the components found in these machines are known as modules. These modules may receive a semiconductor wafer from a another component, place the wafer on a wafer support that is able to spin about its central axis, and dispense a solvent or solution onto the wafer as one of the many steps included in wafer processing. The solvent may be dispensed onto the wafers from a dispense head that is moved into a position over the wafer. Typically, the solvent is fed into inlets of the dispense head through a valve and dispensed onto the wafer through nozzles on the dispense head.

As the solvent is dispensed, some of the solvent often splashes off the wafer. In order to protect other components in the system, catch cups are typically attached to the modules. One portion, the top section, of the catch cup completely surrounds the wafer. Another portion, the mid-section, surrounds the wafer chuck and is below the wafer itself.

Solvent that splashes off the wafer outwards onto the top section of the catch cup often bounces off the top section and splashes back onto either wafer or the dispense head, from where it drips onto the wafer. This extra solvent can damage the integrated circuits that are being formed on the wafer. Solvent may also get between the bottom surface of the wafer and the mid-section of the catch cup. The mid-section of the catch cup typically has flat, horizontal surfaces that allow the solvent to stand and dry. The dried solvent can build up and eventually damage the bottom surface of the wafers.

SUMMARY OF THE INVENTION

The invention provides a semiconductor substrate, or wafer, processing apparatus. The wafer processing apparatus may include a frame, a semiconductor substrate support, a dispense head connected to the frame to dispense a semiconductor processing fluid onto a substrate on the support, and a catch cup, having a top section and a mid-section, connected to the frame around the wafer support. A portion of an inner surface of the top section may face away from a central axis of the semiconductor substrate. An upper surface of the mid-section may have substantially no horizontal portions.

BRIEF DESCRIPTION OF THE DRAWINGS

The invention is described by way of example with reference to the accompanying drawings, wherein.

DETAILED DESCRIPTION OF THE INVENTION

FIG. 1 to FIG. 3G of the accompanying drawings illustrate a semiconductor substrate, or wafer, processing apparatus. The wafer processing apparatus may include a frame, a semiconductor substrate support, a dispense head connected to the frame to dispense a semiconductor processing fluid onto a substrate on the support, and a catch cup, having a top section and a mid-section, connected to the frame around the wafer support. A portion of an inner surface of the top section may face away from a central axis of the semiconductor substrate. An upper surface of the mid-section may have substantially no horizontal portions.

Figure 1:
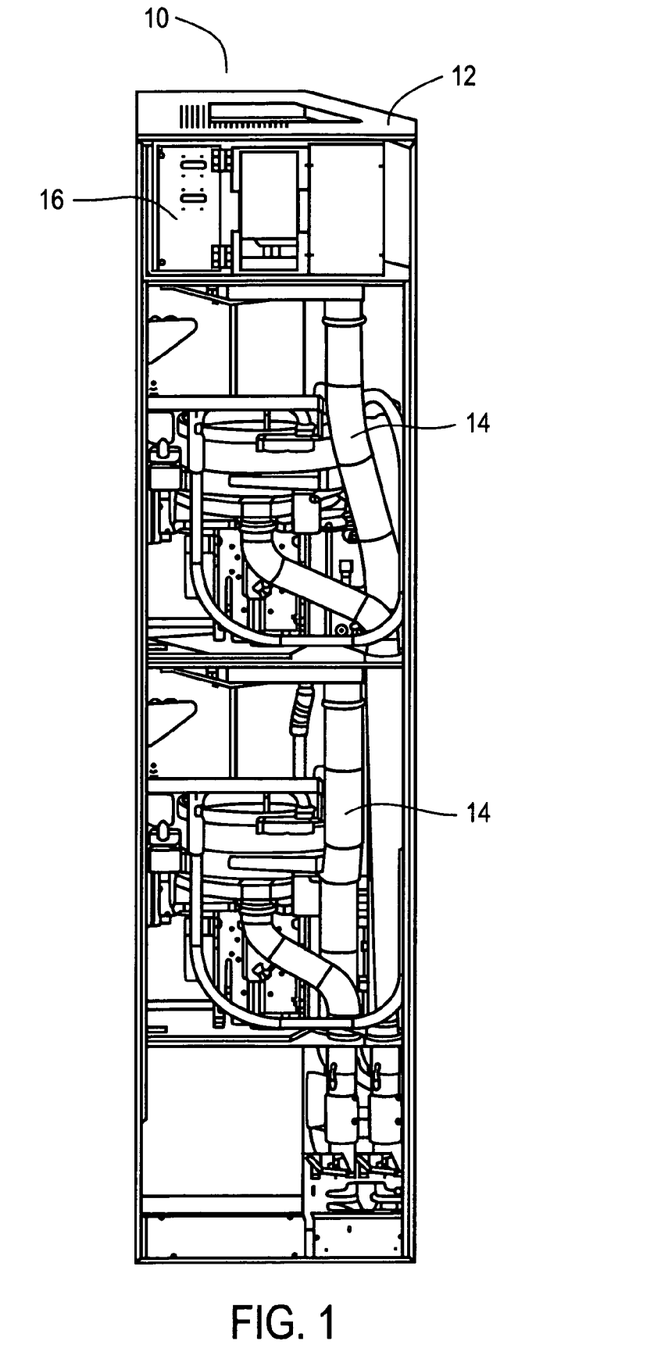
FIG. 1 is a cross-sectional side view of a module stack in a semiconductor wafer processing system, including developer modules and a computer controller.

FIG. 1 illustrates a module stack 10 from a semiconductor wafer processing system. In an embodiment, the module stack 10 may include a frame 12, developer modules 14, and a computer controller 16. The developer modules 14 may be vertically stacked and may be substantially identical. The computer controller 16 may lie on top of the developer modules 14 and although not shown in detail, may be electrically connected to the developer modules 14, and include a computer with a memory for storing a set of instructions and a processor connected to the memory for executing the instructions, as is commonly understood in the art.

FIGS. 2, 3A, 3B, and 3C illustrate one of the developer modules 14. The developer module 14 may include a base 18, a wafer chuck 20, a dispense arm 22, and a catch cup 24.

The base 18 may be attached to the frame 12 of the module stack 10 and be substantially cubic in shape. The wafer chuck 20, or wafer support, may be on top of the base 18, circular in shape, and connected to the base 18 to rotate about a central axis 26 thereof. The wafer chuck 20 may have an upper surface that is substantially flat and in a plane 28 to support a semiconductor wafer. Although not shown in detail, it should be understood that a top piece 30, located at a central portion of the base 18, may include an electric motor, or other actuator, to rotate the wafer chuck 20 about the central axis thereof, along with a semiconductor wafer supported by the wafer chuck 20.

Figure 2:
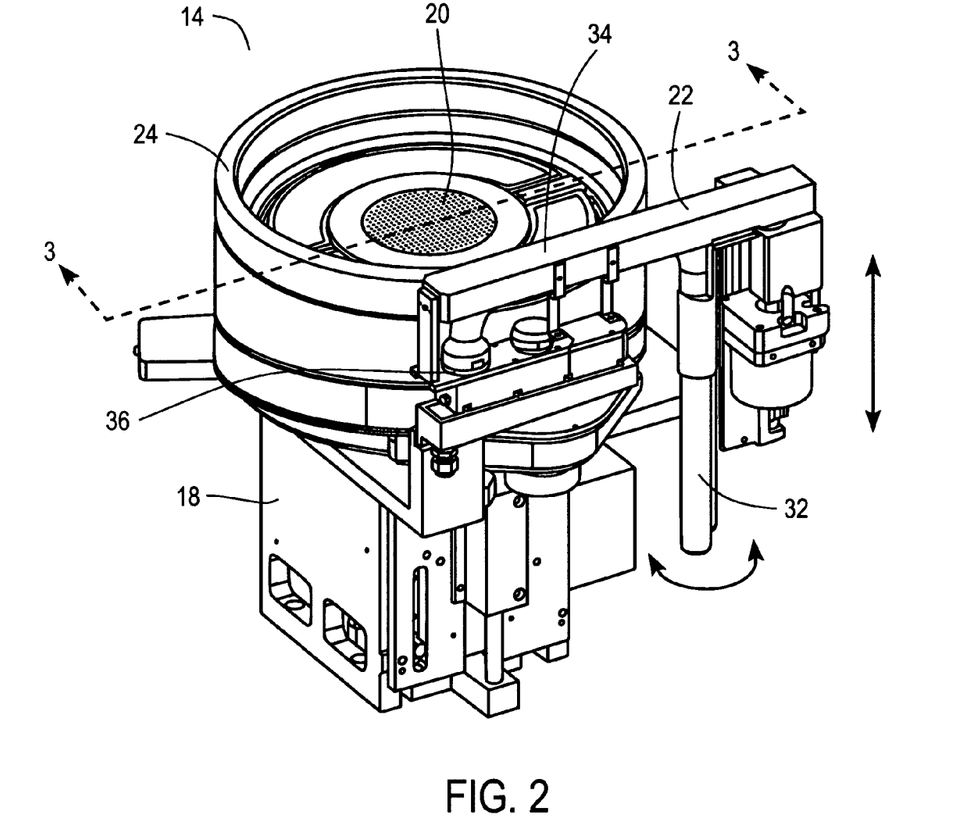
FIG. 2 is a perspective view of one of the developer modules, including a catch cup.
Figure 3A:
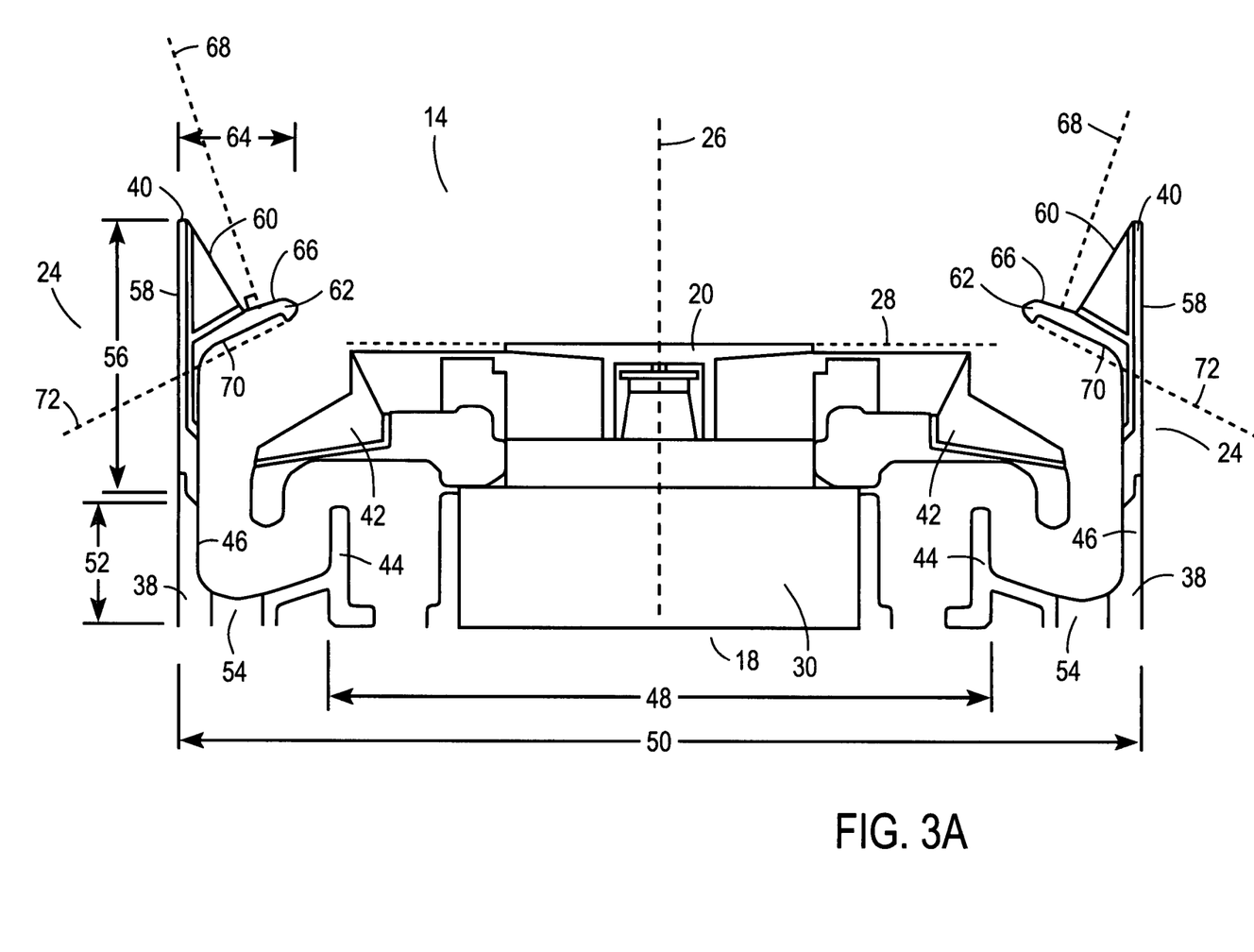
FIGS. 3A–3G are cross section side views on 3—3 in FIG. 2 of the developer module.

Referring to FIGS. 2 and 3A, the dispense arm 22 may include a vertical piece 32, a horizontal piece 34, and a dispense head 36. The vertical piece 32 may be vertically attached to the base 18, and the horizontal piece 34 may be attached to the vertical piece 32 at a first end thereof so that it may translate transverse to the plane 28 of the wafer chuck 20 and rotate over the wafer chuck 20. The dispense head 36 may be attached to a second end of the horizontal piece 34. The vertical piece 32 may include a rotational actuator and a vertical actuator. The rotational actuator may be an electric motor, or other such suitable actuator, which is connected to the dispense arm 22 to rotate the horizontal piece 34 and the dispense head 36 back and forth over the wafer chuck 20. The vertical actuator may be a pneumatic actuator, or other such suitable actuator, which is connected to the base 18 and the horizontal piece 34 to translate the horizontal piece 34 transverse to the plane 28 of the wafer chuck 20.

Referring specifically to FIG. 3A, the catch cup 24 may include a bottom section 38, a top section 40, and a mid-section 42. Although the components of the catch cup 24 are only shown in detail in cross-section, it should be understood that the components may be circularly symmetric around the central axis 26 of the wafer chuck 20. All of the components of the catch cup 24 may be made of a plastic-like material, such as high density polyethelene.

The bottom section 38 may substantially be an annular, ring-shaped body attached to the base 18 with a "U-shaped" cross-section, or U-portion, having an inner wall 44 and an outer wall 46. The bottom section 38 may, for example, have an inner diameter 48 of between 200 and 300 mm across the inner wall 44 and an outer diameter 50 of between 300 and 400 mm across the outer wall 46. The inner 44 and outer 50 walls may have, for example, a height 52 of between 50 and 80 mm. A bottom drain 54, or multiple bottom drains 54, may lie at a bottom of the U-portion. The bottom drain 54 may have a diameter of between 2 and 8 mm and may be connected to either a disposal system or a recycling system. The multiple bottom drains may be symmetrically positioned around the central axis 26 in the U-portion of the bottom section 38.

The top section 40 may also be an annular, ring shaped body attached to an upper end of the outer wall 46 of the bottom section 38 of the catch cup 24. The top section 40 may have a diameter similar to that of the outer diameter 50 of the bottom section 38 and have a height 56, for example, of between 80 and 120 mm above the outer wall 46 of the bottom section 38 of the catch cup 24. The top section 40 may have an outer surface 58, an inner surface 60, and a top lip 62 extending toward the central axis 26 of the wafer chuck 20 from the inner surface 60 thereof to a distance 64 of, for example, between 30 and 60 mm from the outer surface 58. An upper surface 66 of the top lip 62 may face away from, or not face towards, the central axis 26 of the wafer chuck 20 so that a line 68 normal to and extending only away from the upper surface 66 will not intersect the central axis 26 of the wafer chuck 20. In cross-section, the top lip 62 may be angled such that an inner portion of the upper surface 66 is higher than an outer portion of the upper surface 66 above the plane 28. An outer portion of a lower surface 70 of the top lip 62 may be facing the U-portion of the bottom section 38 of the catch cup 24. An inner portion of the lower surface 70 of the top lip 62 may face away from the central axis 26 of the wafer chuck 20 so that a line 72 normal to and extending only away from the inner portion of the lower surface 70 of the top lip 62 will not intersect the central axis 26 of the wafer chuck 20. An inner tip of the top lip 62 may curve downward toward the plane 28 of the wafer chuck.

Figure 3B:
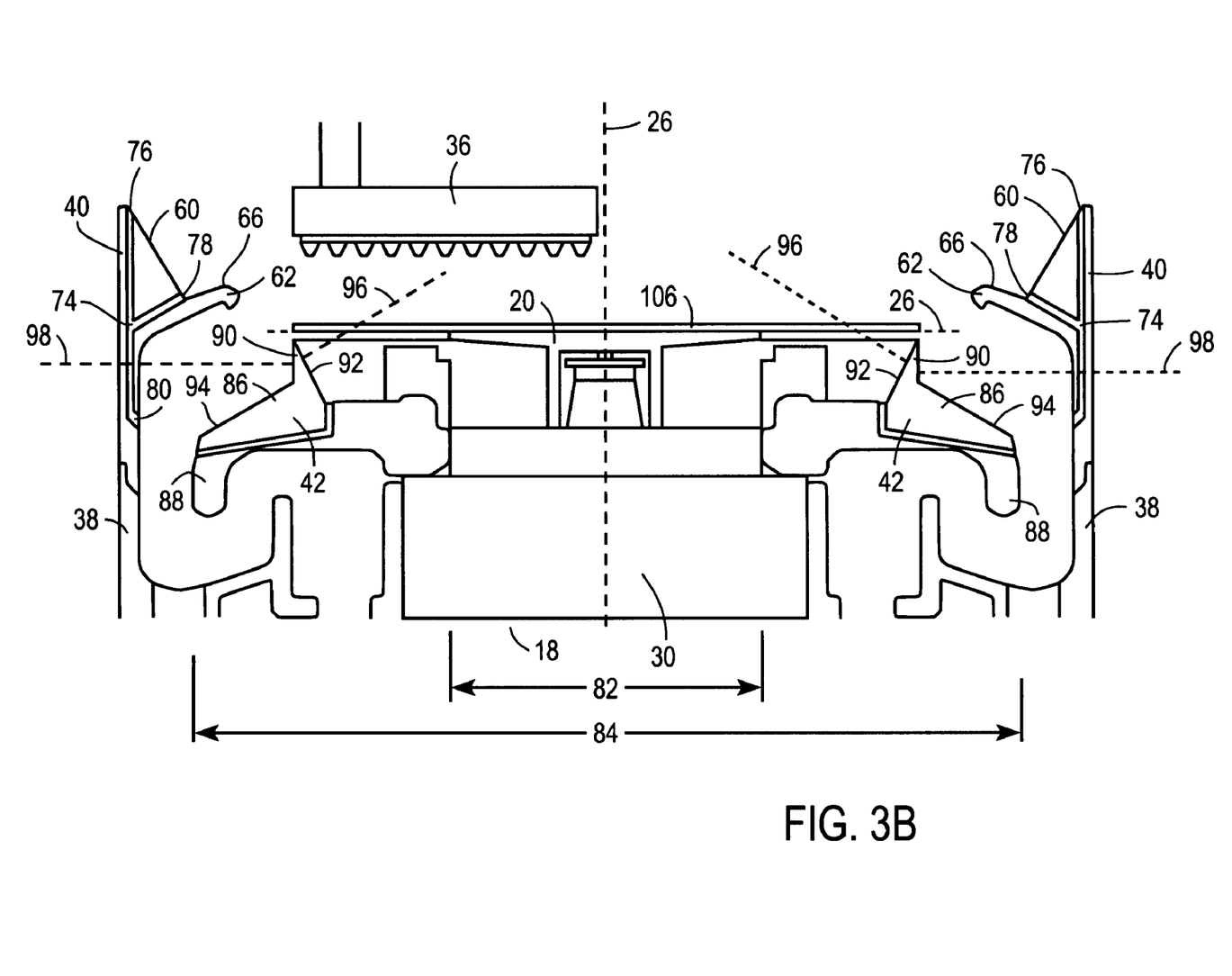

Referring to FIG. 3B, the top section 40 of the catch cup 24 may also include a plurality of sets of top drain openings and a top passageway 74 therethrough interconnecting the sets of top drain openings. A first 76 of the top drain openings may be at an upper end of the inner surface 60 of the top section 40. A second 78 of the top drain openings may be on the inner surface 60 of the top section 40 just above the upper surface 66 of the top lip 62. A third 80 of the top drain openings may be on the inner surface 60 below the top lip 62. The top passageway 74 may have a vertical portion that runs substantially parallel to the central axis 26 of the wafer chuck 20 between the first 76 and third 80 top drain openings and an angled portion that runs substantially parallel to the upper surface 66 of the top lip 62 between the third opening 80 and the vertical portion. The top drain openings and the top passageway 74 may be substantially circular and have a diameter of, for example, between 1 and 5 mm. The sets of top drain openings may be positioned around the central axis 26 similarly to the bottom drains 54.

In combination, the top section 40 and bottom section 38 may form a large substantially annular, ring-shaped body attached to the top of the base 18 and extending upwards from the base 18.

Figure 3C:
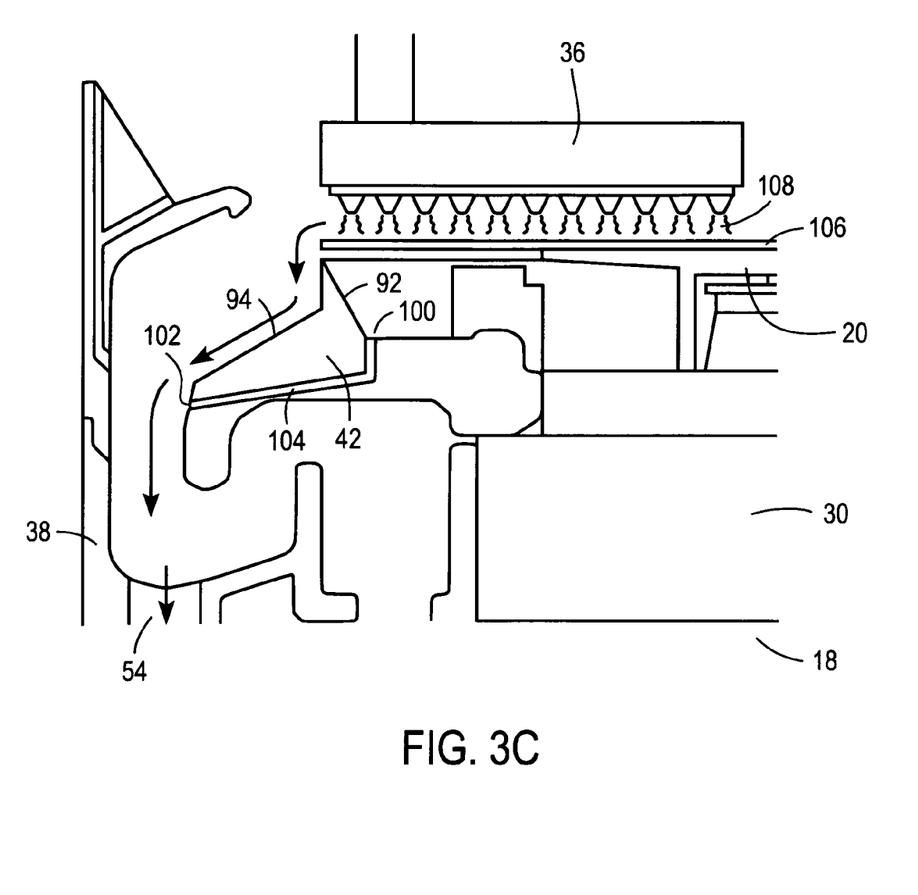

Referring to FIGS. 3B and 3C, the mid-section 42 of the catch cup may substantially be a flat ring-shaped body that is secured to a periphery of the top piece 30 of the base 18 and surrounds the wafer chuck 20. The mid-section 42 may have, for example, an inner diameter 82 of between 100 and 200 mm and an outer diameter 84 of between 250 and 350 mm. The mid-section 42 may also have peak formation 86 extending upwards from a middle region of an upper, or top, surface thereof and a bottom lip 88 extending downwards from a periphery thereof. The entire mid-section 42 may lie below the plane 26.

The peak formation 86 may cover the upper surface and may have a peak 90 that divides the upper surface into an inner portion 92 and an outer portion 94. The inner portion 92 of the upper surface may face the central axis 26 of the wafer chuck 20 so that a line 96 normal to and extending only away from the inner portion 92 would intersect the central axis 26 of the wafer chuck 20.

The outer portion 94 of the upper surface may face away from the central axis 26 of the wafer chuck 20. A line 98 normal to and extending only away from an upper portion of the outer portion 94 of the upper surface may be substantially perpendicular to and will not intersect the central axis 26 of the wafer chuck 20.

The inner 92 and outer 94 portions of the upper surface of the mid-section 42 of the catch cup 24 may intersect at the peak 90 so that the peak formation 86 has virtually no horizontal surfaces so that a liquid deposited thereon would flow off. Each portion of the upper surface of the mid-section 42 may be facing either towards or away from the central axis 26 of the wafer chuck 20.

The bottom lip 88 may partially extend into the U-portion of the bottom section 38 of the catch cup 24.

Referring specifically to FIG. 3C, the mid-section 42 may also a have a plurality of pairs of first 100 and second 102 mid-drain openings and mid-passageways 104 interconnecting the pairs of first 100 and second 102 mid-drain openings. The first mid-drain openings 100 may be on a lower portion of the inner portion 92 of the upper surface and the second mid-drain openings may be on a lower portion of the outer portion 94 of the upper surface. The first mid-drain openings 100, the second mid-drain openings 102, and the mid-passageways 104 may be substantially circular and have diameters of, for example, between 1 and 5 mm. The upper surface of the mid-section 42 of the catch cup 24 may be defined as lying between the first 100 and second 102 mid-drain openings. The pairs of first 100 and second 102 mid-drain openings may be positioned around the central axis 26 similarly to the bottom drains 54 and the sets of top drain openings.

In use, as illustrated in FIGS. 2 and 3B, a semiconductor substrate, such as a wafer 106, which may have a diameter, for example, of 200 or 300 mm, may be placed on the wafer chuck 20. The wafer 106 may have a central axis that, when the wafer 106 is placed on the wafer chuck 20, is congruent to the central axis 26 of the wafer chuck 20. The wafer 106 may also have a surface in a plane that, when the wafer 106 is placed on the wafer chuck 20, is congruent to the plane 28 of the wafer chuck 20. The wafer 106 may have an outer edge, which when the wafer 106 is placed on the wafer chuck 20, lies directly above the peak 90. There may be an air space between the peak 90 and the wafer 106 of, for example, between 0.1 and 1 mm.

The computer controller 16 may control the rotational actuator and the vertical actuator to move the dispense arm 22. The vertical actuator may lift the dispense arm 22 to a height sufficient for the dispense head 36 to clear the top section 40 of the catch cup 24. The rotational actuator may then rotate the dispense arm 22 so that the dispense head 36 is suspended above the semiconductor wafer 106 as illustrated in FIG. 3B.

As shown in FIG. 3C, a liquid 108, such as a photoresist developer solvent, deionized water, or other such semiconductor processing liquid, may be dispensed onto the wafer 106 as the actuator within the base 18 spins the wafer chuck 20 and thus the wafer 106.

As the solvent 108 hits the wafer 106, much of the solvent 106 falls off the edge of the wafer 106, flows down the outer portion 94 of the upper surface of the mid-section 42, and flows down one of the bottom drains 54 in the bottom section 38 of the catch cup 24, as indicated by the flow arrows in FIG. 3C.

Figure 3D:
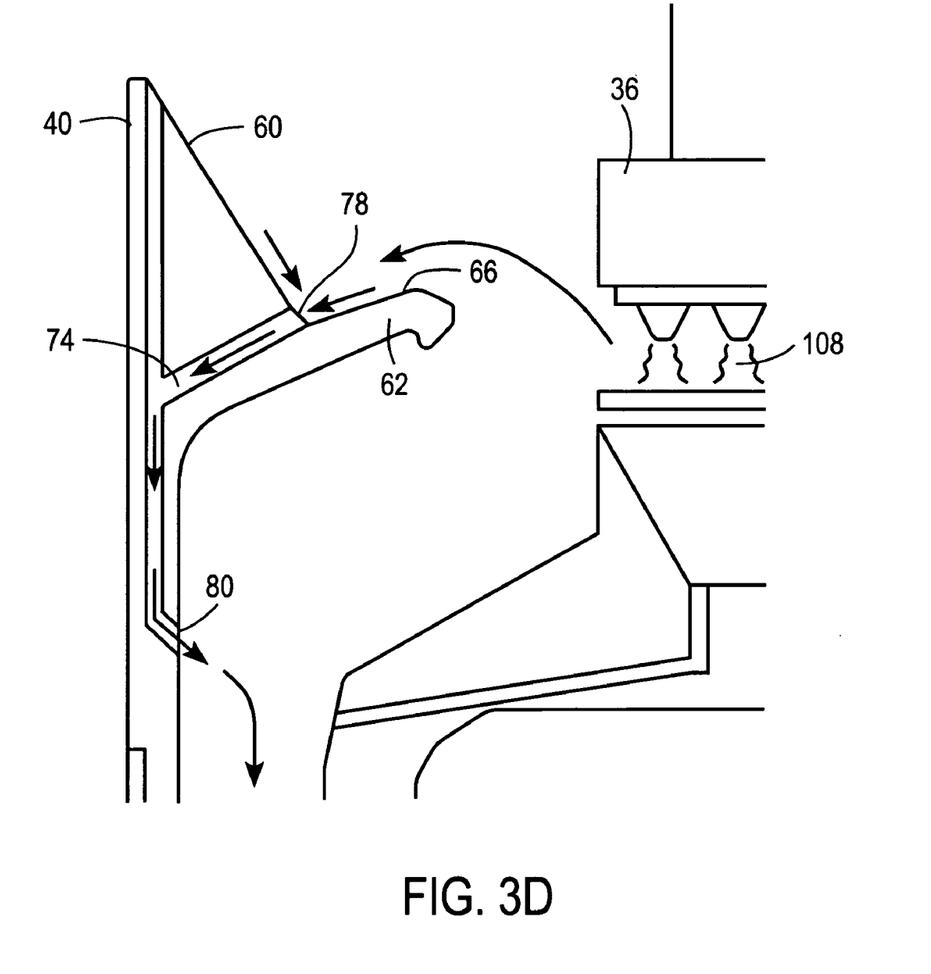

However, as illustrated in FIGS. 3D–3G, some of the solvent 108 may splash off of the wafer 106 onto different portions of the catch cup 24, as indicated by the flow arrows in FIGS. 3D–3G. Referring specifically to FIG. 3D, any solvent 108 that splashes onto the upper surface 66 of the top lip 62, or the inner surface 60 of the top section 40 of the catch cup 24 above the top lip 62, flows into the second top drain opening 78 into the top passageway 74. The solvent 108 then flows down the top passageway 74 and leaves the top passageway 74 from the third top opening 80. Referring back to FIG. 3C, the solvent 108 then flows to the bottom of the U-portion of the bottom section 38 of the catch cup 24. The solvent 108 then flows into one of the bottom drains 54.

Figure 3E:
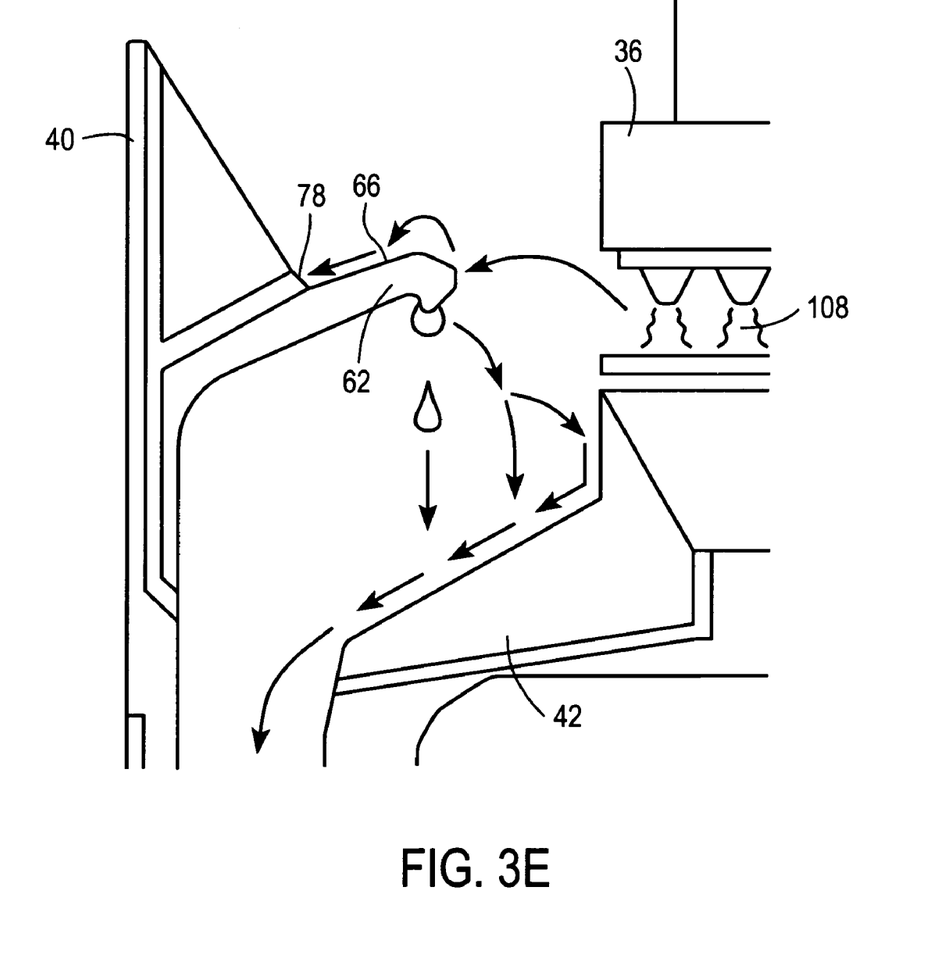

Referring to FIG. 3E, any solvent 108 that lands on the tip of the top lip 62, beads at the tip and drips downwards onto the mid-section 42 of the catch cup 24. The solvent 108 flows down the outer portion 94 of the upper surface of the mid-section 42, into the U-section of the bottom section 38, and flows out one of the bottom drains 54. Because of the shape of the top lip 62, little solvent 108 is splashed back onto the dispense head 36. Some solvent may splash off the tip and flow down the upper surface 66 of the top lip 62 and into the second top drain opening 78.

Figure 3F:
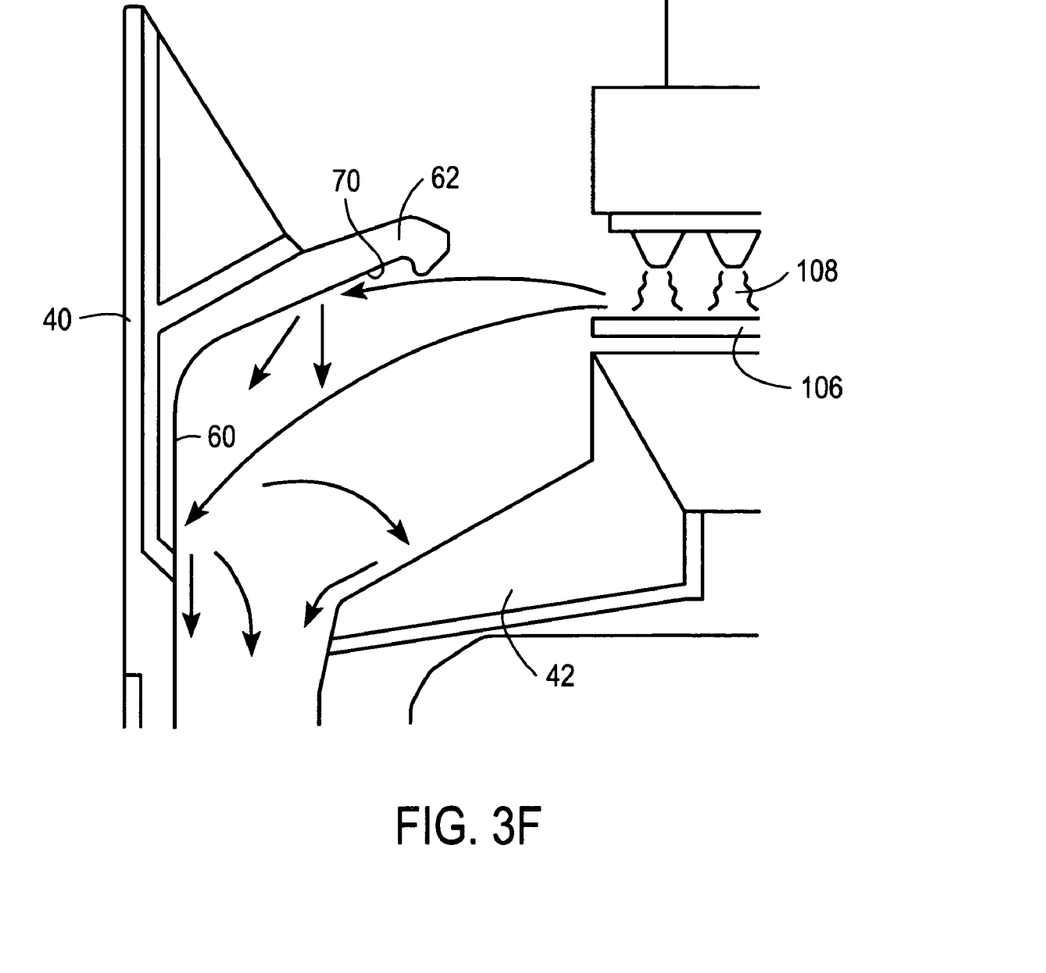

Referring to FIG. 3F, any solvent 108 that splashes off the lower surface 70 of the top lip 62 or the inner surface 60 of the top section 40 of the catch cup 24 below the top lip 62, is directed away from the wafer 106 and the dispense head 36. The solvent 108 either lands on the mid-section 42 or falls directly into the U-portion of the bottom section 38. Either way, the solvent 108 flows into one of the bottom drains 54.

Figure 3G:
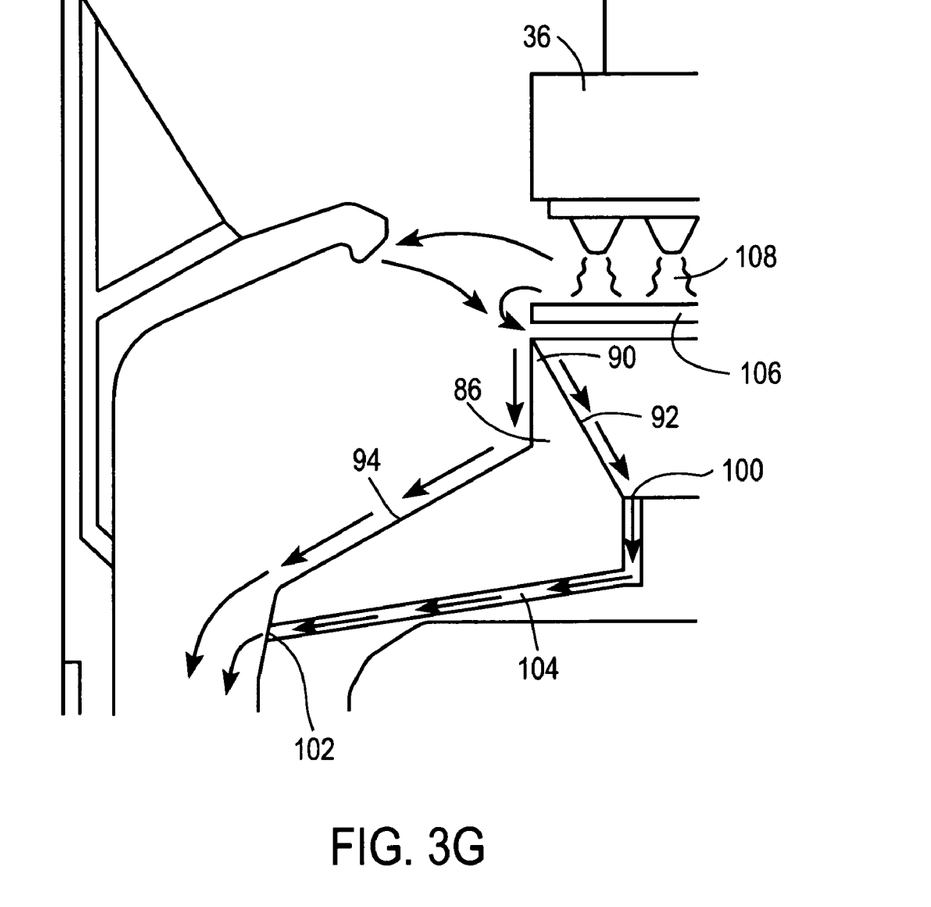

Referring to FIG. 3G, any solvent 108 that is caught between the peak 90 of the peak formation 86 and the wafer 106, flows down either the inner 92 or outer 94 portion of the upper surface of the mid-section 42. The solvent 108 that flows down the outer portion 94 drops into the U-portion of the bottom section 38 of the catch cup 24 and flows out one of the bottom drains 54. The solvent 108 that flows down the inner portion 92 of the upper surface enters the first mid-drain opening 100, flows through the mid-passageway 104, and exits through the second mid-drain opening 102. The solvent 108 then drops into the U-portion of the bottom section 38 of the catch cup 24 and flows into one of the bottom drains 54. Because the peak formation 86 has substantially no horizontal surfaces, the solvent 108 does not get caught anywhere on the upper surface of the mid-section 42. Therefore, the solvent 108 is not able to dry on any portion of the mid-section 42 of the catch cup 24.

One advantage is that because of the shape of the inner surface of the top section of the catch cup and the top lip, the amount of solvent that splashes back onto the dispense head, onto the wafer, and between the wafer and the mid-section of the catch cup is minimized. Therefore, the likelihood that any unwanted solvent will be dispensed onto the wafer is minimized. Another advantage is that any solvent that does get between the wafer and the mid-section is not allowed to dry. Therefore, the likelihood that the bottom of the wafer will be damaged by unwanted solvent is also minimized.

Other embodiments may use the top section and mid-section of the catch cup in other types of modules, such as ones that dispense photoresist, or other types of semiconductor processing fluids.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A semiconductor substrate processing apparatus comprising:
   a frame;
   a semiconductor substrate support to support a semiconductor substrate, the semiconductor substrate having a central axis;
   a dispense head connected to the frame to dispense a semiconductor processing fluid onto the semiconductor substrate; and
   a catch cup section attached to the frame having an inner surface and an outer surface, at least a portion of the inner surface not facing towards the central axis of the semiconductor substrate, wherein the catch cup further comprises a lip extending from the inner surface thereof towards the central axis of the semiconductor substrate, and wherein the lip is angled such that an inner portion of an upper surface of the lip is higher than an outer portion of the upper surface of the lip, and wherein the lip comprises a top lip having an inner tip curving downward toward a plane of the semiconductor substrate support.

2. The semiconductor substrate processing apparatus of claim 1, wherein a line normal to and extending only away from the portion of the inner surface does not intersect the central axis of the semiconductor substrate.

3. The semiconductor substrate processing apparatus of claim 2, wherein the lip further comprises an upper surface and a lower surface, at least a portion of the upper surface of the lip facing away from the central axis of the semiconductor substrate.

4. The semiconductor substrate processing apparatus of claim 3, wherein a line normal to and extending only away from the portion of the upper surface of the lip does not intersect the central axis of the semiconductor substrate.

5. The semiconductor substrate processing apparatus of claim 4, wherein at least a portion of the lower surface of the lip faces away from the central axis of the semiconductor substrate.

6. The semiconductor substrate processing apparatus of claim 5, wherein a line normal to and extending only away from the portion of the lower surface of the lip does not intersect the central axis of the semiconductor substrate.

7. The semiconductor substrate processing apparatus of claim 6, wherein the catch cup further comprises at least two drain openings and a passageway therethrough interconnecting the at least two drain openings.

8. A semiconductor substrate processing apparatus comprising:
a frame;
a semiconductor substrate support to support a semiconductor substrate, the semiconductor substrate having a central axis;
a dispense head connected to the frame to dispense a semiconductor processing fluid onto the semiconductor substrate; and
a catch cup section attached to the frame having an inner surface and an outer surface, at least a portion of the inner surface not facing towards the central axis of the semiconductor substrate;
wherein a line normal to and extending only away from the portion of the inner surface does not intersect the central axis of the semiconductor substrate,
wherein the catch cup further comprises a lip extending from the inner surface thereof towards the central axis of the semiconductor substrate,
wherein the lip further comprises an upper surface and a lower surface, at least a portion of the upper surface of the lip facing away from the central axis of the semiconductor substrate,
wherein a line normal to and extending only away from the portion of the upper surface of the lip does not intersect the central axis of the semiconductor substrate wherein at least a portion of the lower surface of the lip faces away from the central axis of the semiconductor substrate,
wherein a line normal to and extending only away from the portion of the lower surface of the lip does not intersect the central axis of the semiconductor substrate,
wherein the catch cup further comprises at least two drain openings and a passageway therethrough interconnecting the at least two drain openings, and wherein a first of the drain openings is on the inner surface of the catch cup above the lip and a second of the drain opening is on the inner surface of the catch cup below the lip such that a liquid on the upper surface of the lip flows into the first drain opening, through the passageway, and out of the second opening.

9. The semiconductor substrate processing apparatus of claim 8, wherein an upper surface of the semiconductor substrate is in a plane, an inner portion of the upper surface of the lip being a first height above the plane, an outer portion of the upper surface of the lip being a second height above the plane, the first height being greater than the second height.

10. The semiconductor substrate processing apparatus of claim 9, wherein the semiconductor substrate is a wafer.

11. A semiconductor substrate processing apparatus comprising:
a frame;
a semiconductor substrate support to support a semiconductor substrate, the semiconductor substrate having a central axis;
a dispense head connected to the frame to dispense a semiconductor processing fluid onto the semiconductor substrate; and
a catch cup section attached to the frame around the semiconductor substrate support and having an upper surface, substantially all of the upper surface either facing towards or away from the central axis of the semiconductor substrate, wherein the catch cup further comprises a lip extending from the inner surface thereof towards the central axis of the semiconductor substrate, and wherein the lip is angled such that an inner portion of an upper surface of the lip is higher than an outer portion of the upper surface of the lip, and wherein the lip comprises a top lip having an inner tip curving downward toward a plane of the semiconductor substrate support.

12. The semiconductor substrate processing apparatus of claim 11, wherein the semiconductor substrate has a surface in a plane.

13. The semiconductor substrate processing apparatus of claim 12, wherein substantially all of the catch cup section is below the plane.

14. The semiconductor substrate processing apparatus of claim 13, wherein substantially no portion of the upper surface of the catch cup is parallel to the plane.

15. The semiconductor substrate processing apparatus of claim 14, wherein the catch cup section further comprises a peak formation extending upwards from the upper surface thereof, the peak formation dividing the upper surface into inner and outer portions, the inner portion of the upper surface facing towards the central axis of the semiconductor substrate, the outer portion of the upper surface facing away from the central axis of the semiconductor substrate.

16. The semiconductor substrate processing apparatus of claim 15, wherein a line normal to and extending only away from the inner portion of the upper surface of the catch cup intersects the central axis of the semiconductor substrate and a line normal to and extending only away from the outer portion of the upper surface of the catch cup does not intersect the central axis of the semiconductor substrate.

17. A semiconductor substrate processing apparatus comprising:
a frame;
a semiconductor substrate support to support a semiconductor substrate, the semiconductor substrate having a central axis;
a dispense head connected to the frame to dispense a semiconductor processing fluid onto the semiconductor substrate; and
a catch cup section attached to the frame around the semiconductor substrate support and having an upper surface, substantially all of the upper surface either facing towards or away from the central axis of the semiconductor substrate; and
wherein the semiconductor substrate has a surface in a plane,
wherein substantially all of the catch cup section is below the plane,
wherein substantially no portion of the upper surface of the catch cup is parallel to the plane,
wherein the catch cup section further comprises a peak formation extending upwards from the upper surface thereof, the peak formation dividing the upper surface into inner and outer portions, the inner portion of the upper surface facing towards the central axis of the semiconductor substrate, the outer portion of the upper surface facing away from the central axis of the semiconductor substrate,
wherein a line normal to and extending only away from the inner portion of the upper surface of the catch cup intersects the central axis of the semiconductor substrate and a line normal to and extending only away from the outer portion of the upper surface of the catch cup does not intersect the central axis of the semiconductor substrate, and wherein the semiconductor substrate has an outer edge and a peak of the peak formation is substantially directly below the outer edge of the semiconductor substrate.

18. The semiconductor substrate processing apparatus of claim 17, wherein the catch cup section further comprises at least two drain openings and a passageway therethrough interconnecting the drain openings.

19. The semiconductor substrate processing apparatus of claim 18, wherein a first of the drain openings is on the inner portion of the upper surface of the catch cup section and a second of the drain openings is on the outer portion of the upper surface of the catch cup section such that a liquid on the inner portion of the upper surface of the catch cup section flows into the first drain opening, through the passageway, and out of the second drain opening.

20. A semiconductor substrate processing apparatus comprising:
a frame;
a semiconductor substrate support to support a semiconductor substrate, the semiconductor substrate having a central axis;
a dispense head connected to the frame to dispense a semiconductor processing fluid onto the semiconductor substrate; and
a catch cup having a mid-section and a top section, the mid-section being attached to the frame around the semiconductor substrate support and having a top surface, substantially all of the top surface either facing towards or away from the central axis of the semiconductor substrate, the top section being attached to the frame around the mid-section and having an inner surface and an outer surface, at least a portion of the inner surface facing away from the central axis of the semiconductor substrate,
wherein the top section of the catch cup further comprises a lip extending from the inner surface thereof towards the central axis of the semiconductor substrate, and wherein the lip is angled such that an inner portion of an upper surface of the lip is higher than an outer portion of the upper surface of the lip, and wherein the lip comprises a top lip having an inner tip curving downward toward a plane of the semiconductor substrate support.

21. The semiconductor substrate processing apparatus of claim 20, wherein the semiconductor substrate has a surface in a plane.

22. The semiconductor substrate processing apparatus of claim 21, wherein substantially no portion of the top surface of the mid-section of the catch cup is parallel to the plane.

23. The semiconductor substrate processing apparatus of claim 22, wherein a line normal and extending only away from the portion of the inner surface of the top section does not intersect the central axis of the semiconductor substrate.

24. The semiconductor substrate processing apparatus of claim 23, wherein the mid-section of the catch cup further comprises a peak formation extending upwards from the top surface thereof, the peak formation dividing the top surface into inner and outer portions.

25. The semiconductor substrate processing apparatus of claim 24, wherein the lip of the top section of the catch cup further comprises an upper surface and a lower surface, at least a portion of the upper surface of the lip facing away from the central axis of the semiconductor substrate.

26. The semiconductor substrate processing apparatus of claim 25, wherein the inner portion of the top surface of the mid-section faces towards the central axis of the semiconductor substrate and the outer portion of the top surface of the mid-section faces away from the central axis of the semiconductor substrate.

27. The semiconductor substrate processing apparatus of claim 26, wherein a line normal and extending only away from the upper surface of the lip does not intersect the central axis of the semiconductor substrate.

28. The semiconductor substrate processing apparatus of claim 27, wherein a line normal to and extending only away from the inner portion of the top surface of the mid-section of the catch cup intersects the central axis of the semiconductor substrate and a line normal to and extending only away from the outer portion of the top surface of the mid-section of the catch cup does not intersect the central axis of the semiconductor substrate.

29. The semiconductor substrate processing apparatus of claim 28, wherein at least a portion of the lower surface of the lip of the top section of the catch cup faces away from the central axis of the semiconductor substrate.

30. The semiconductor substrate processing apparatus of claim 29, wherein a line normal to and extending only away from the lower surface of the lip of the top section of the catch cup does not intersect the central axis of the semiconductor substrate.

31. A semiconductor substrate processing apparatus comprising:
a frame;
a semiconductor substrate support to support a semiconductor substrate, the semiconductor substrate having a central axis;
a dispense head connected to the frame to dispense a semiconductor processing fluid onto the semiconductor substrate; and
a catch cup having a mid-section and a top section, the mid-section being attached to the frame around the semiconductor substrate support and having a top surface, substantially all of the top surface either facing towards or away from the central axis of the semiconductor substrate, the top section being attached to the frame around the mid-section and having an inner surface and an outer surface, at least a portion of the inner surface facing away from the central axis of the semiconductor substrate;
wherein the semiconductor substrate has a surface in a plane;
wherein substantially no portion of the top surface of the mid-section of the catch cup is parallel to the plane;
wherein a line normal and extending only away from the portion of the inner surface of the top section does not intersect the central axis of the semiconductor substrate;
wherein the top section of the catch cup further comprises a lip extending from the inner surface thereof towards the central axis of the semiconductor substrate;
wherein the mid-section of the catch cup further comprises a peak formation extending upwards from the top surface thereof, the peak formation dividing the top surface into inner and outer portions;
wherein the lip of the top section of the catch cup further comprises an upper surface and a lower surface, at least a portion of the upper surface of the lip facing away from the central axis of the semiconductor substrate;
wherein the inner portion of the top surface of the mid-section faces towards the central axis of the semiconductor substrate and the outer portion of the top surface of the mid-section faces away from the central axis of the semiconductor substrate;

wherein a line normal and extending only away from the upper surface of the lip does not intersect the central axis of the semiconductor substrate;

wherein a line normal to and extending only away from the inner portion of the top surface of the mid-section of the catch cup intersects the central axis of the semiconductor substrate and a line normal to and extending only away from the outer portion of the top surface of the mid-section of the catch cup does not intersect the central axis of the semiconductor substrate;

wherein at least a portion of the lower surface of the lip of the top section of the catch cup faces away from the central axis of the semiconductor substrate;

wherein a line normal to and extending only away from the lower surface of the lip of the top section of the catch cup does not intersect the central axis of the semiconductor substrate; and wherein the semiconductor substrate has an outer edge and a peak of the peak formation is substantially directly below the outer edge of the semiconductor substrate.

32. The semiconductor substrate processing apparatus of claim 31, wherein the mid-section of the catch cup further comprises first and second mid-drain openings and a mid-passageway therethrough interconnecting the first and second mid-drain openings.

33. The semiconductor substrate processing apparatus of claim 32, wherein the top section of the catch cup further comprises first and second top-drain openings and a top-passageway therethrough interconnecting the first and second top-drain openings.

34. The semiconductor substrate processing apparatus of claim 33, wherein the first mid-drain opening is on the inner portion of the top surface of the mid-section of the catch cup and the second mid-drain opening is on the outer portion of the top surface of the mid-section of the catch cup such that a liquid on the inner portion of the top surface of the mid-section of the catch cup flows into the first mid-drain opening, through the mid-passageway, and out of the second mid-drain opening.

35. The semiconductor substrate processing apparatus of claim 34, wherein the first top-drain opening is on the inner surface of the top section of the catch cup above the lip and the second top-drain opening is on the inner surface of the top section of the catch cup below the lip such that a liquid on the upper surface of the lip flows into the first top-drain opening, through the top-passageway, and out of the second opening.

* * * * *